United States Patent
Cho

(10) Patent No.: US 7,683,420 B2
(45) Date of Patent: Mar. 23, 2010

(54) NONVOLATILE MEMORY SEMICONDUCTOR DEVICE AND METHOD FOR MANUFACTURING SAME

(75) Inventor: Shien Cho, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 830 days.

(21) Appl. No.: 11/492,912

(22) Filed: Jul. 26, 2006

(65) Prior Publication Data

US 2007/0023814 A1 Feb. 1, 2007

(30) Foreign Application Priority Data

Jul. 28, 2005 (JP) ............................. 2005-218970

(51) Int. Cl.
  *H01L 29/76* (2006.01)
  *H01L 29/788* (2006.01)
(52) U.S. Cl. ................... 257/314; 257/315; 257/316; 257/286
(58) Field of Classification Search ......... 257/314–316, 257/288, 286
See application file for complete search history.

(56) References Cited

U.S. PATENT DOCUMENTS 6,764,902 B2 * 7/2004 Kobayashi et al. .......... 438/257

2004/0185647 A1 * 9/2004 Dong et al. ................. 438/585
2006/0166452 A1 * 7/2006 Rao et al. ................... 438/369

FOREIGN PATENT DOCUMENTS

| JP | 11-317463 A | 11/1999 |
| JP | 2000-269355 A | 9/2000 |
| JP | 2001-338997 A | 12/2001 |

* cited by examiner

*Primary Examiner*—Kenneth A Parker
*Assistant Examiner*—Joseph Nguyen
(74) *Attorney, Agent, or Firm*—Sughrue Mion, PLLC

(57) ABSTRACT

A nonvolatile memory semiconductor device and a method for manufacturing thereof are provided to avoid deterioration of the tunnel insulating film to increase frequency of writing data on the nonvolatile memory semiconductor device and erasing thereof. Concentration of atomic nitrogen in a tunnel insulating film 151 of a nonvolatile memory semiconductor device 1 is 0.1 to 5 atomic %. In addition, larger amount of atomic nitrogen in the tunnel insulating film 151 is distributed primarily in the interface layer of the tunnel insulating film 151, and concentration of atomic nitrogen in the interface layer is 10 times or more higher than concentration of atomic nitrogen in other portion of the tunnel insulating film 151. Further, density per unit area of atomic nitrogen in the surface of the tunnel insulating film 151 contacting with the floating gate is equal to or lower than $4 \times 10^{14}$ atoms/cm$^2$.

12 Claims, 13 Drawing Sheets

BIDING CONDITION N1

BIDING CONDITION N2

| BIDING CONDITION N3 | BIDING CONDITION N4 | BIDING CONDITION N5 |
|---|---|---|
|  |  |  |

NONVOLATILE MEMORY SEMICONDUCTOR DEVICE AND METHOD FOR MANUFACTURING SAME

This application is based on Japanese patent application No. 2005-218,970, the content of which is incorporated hereinto by reference.

BACKGROUND

1. Field of the Invention

The present invention relates to a nonvolatile memory semiconductor device and a method for manufacturing thereof.

2. Related Art

In the conventional technologies, a method for preventing deterioration of a gate insulating film or a tunnel insulating film by doping nitrogen to a gate insulating film of a metal oxide semiconductor (MOS) transistor or a tunnel insulating film of a nonvolatile memory semiconductor device to prevent from an electron trap is proposed (see, for example, Japanese Patent No. 3,264,265). The tunnel insulating film of the nonvolatile memory semiconductor device maintains electron in a floating gate. On the contrary, a tunneling current flows through the aforementioned tunnel insulating film in each time a writing or an erasing data is conducted. Therefore, deterioration by flowing tunneling current is caused in the tunnel insulating film of the nonvolatile memory semiconductor device. Although electron is not trapped of by the tunnel insulating film when no deterioration is caused in the tunnel insulating film as shown in FIG. 13A, a trap site for electron is created in the tunnel insulating film when a deterioration is caused in the tunnel insulating film as shown in FIG. 13B, and electron is trapped by this trap site. This provides a weakened electric field of the tunnel insulating film, leading to less flow of a tunneling current therethrough. Such deterioration of the tunnel insulating film causes a reduced frequency of writing data to the nonvolatile memory semiconductor device and erasing data stored in the nonvolatile memory semiconductor device. To solve the problem, nitrogen is doped into the tunnel insulating film, so that deterioration of the tunnel insulating film is prevented and an attempt of increasing frequency of writing data to the nonvolatile memory semiconductor device and erasing data stored in the nonvolatile memory semiconductor device is proposed (see, for example, Japanese Patent Laid-Open No. 2001-338,997). In addition to the above-described Japanese Patent Laid-Open No. 2001-338,997, another typical attempt of doping nitrogen to the tunnel insulating film is disclosed in, for example, Japanese Patent Laid-Open No. H11-317,463 (1999). Japanese Patent Laid-Open No. H11-317,463 discloses a procedure, in which a thin gate insulating film (thermal oxidation film) is formed on a silicon substrate, and a chemical vapor deposition (CVD) oxide film is deposited thereon, and then, for example, an annealing is conducted within a nitrogen atmosphere at 900 degree C. for around 10 minutes, and further, a floating gate is formed thereon.

Nevertheless, in recent years, it is a current situation that further increase in frequency of writing data on the nonvolatile memory semiconductor device and erasing thereof is required. As a result of the various experiments of the present inventors, there is still a case that the quality of the tunnel insulating film deteriorated, even if nitrogen is doped into the tunnel insulating film, and therefore has been found that it is difficult to fulfill the needs of further increasing the frequency of writing and erasing data in the technologies described in the above-described prior art documents.

SUMMARY OF THE INVENTION

According to one aspect of the present invention, there is provided a nonvolatile memory semiconductor device, comprising: a semiconductor substrate; a floating gate provided on the semiconductor substrate; a control gate provided on the semiconductor substrate; and a tunnel insulating film, composed of a silicon oxide film and disposed adjacent to the floating gate, wherein concentration of atomic nitrogen in the tunnel insulating film is 0.1 to 5 atomic %, and wherein concentration of atomic nitrogen in an interface layer of the tunnel insulating film is 10 times or higher than concentration of atomic nitrogen in other portion of the tunnel insulating film except the interface layer, the interface layer extending from a surface of the tunnel insulating film in a side of the floating gate to a vicinity of the surface.

It has been found from results of experiments conducted by the present inventors that, in order to surely avoid a generation of a trap site for electron to prevent deterioration of the tunnel insulating film, it is critical to enhance concentration of atomic nitrogen in a region extending from a surface of the tunnel insulating film in a side of the floating gate to a vicinity of the surface (i.e., interface layer of the tunnel insulating film). Deterioration of the tunnel insulating film can be prevented by enhancing concentration of atomic nitrogen in a region extending from a surface of the tunnel insulating film in a side of the floating gate to a vicinity of the surface. An advantageous effect of preventing deterioration of the tunnel insulating film becomes more considerable by providing concentration of atomic nitrogen in an interface layer of the tunnel insulating film of 10 times or more higher than concentration of atomic nitrogen in other portions. In addition to above, when concentration of atomic nitrogen in the tunnel insulating film is lower than 0.1 atomic %, no advantageous effect of preventing a generation of a trap site for electron by adding nitrogen is not obtained. On the contrary, it is considered that concentration of atomic nitrogen on the surface of the tunnel insulating film in the side of the floating gate side is increased when concentration of atomic nitrogen in the tunnel insulating film is larger than 5 atomic %, and thus the surface of the tunnel insulating film in the side of the floating gate is roughened, leading to decreasing flow of on-state current. Since the present invention employs that concentration of atomic nitrogen in the tunnel insulating film is set to be within a range of from 0.1 atomic % to 5 atomic %, such problem is not created. As described above, according to the present invention, deterioration of the tunnel insulating film can be prevented and frequency of writing data on the nonvolatile memory semiconductor device and erasing thereof can be increased.

According to another aspect of the present invention, there is provided a method for manufacturing a nonvolatile memory semiconductor device, the nonvolatile memory semiconductor device comprising: a semiconductor substrate; a floating gate provided on the semiconductor substrate; a control gate; a tunnel insulating film, disposed adjacent to the floating gate and composed of a silicon oxide film, wherein concentration of atomic nitrogen in the tunnel insulating film is 0.1 to 5 atomic %, and wherein the method further comprises forming the tunnel insulating film to have concentration of atomic nitrogen in an interface layer of the tunnel insulating film that is 10 times or more higher than concentration of atomic nitrogen in other portion of the tunnel insulating film except the interface layer, the interface layer extending from a surface of the tunnel insulating film in a side of the floating gate to a vicinity of the surface.

According to the present invention, a nonvolatile memory semiconductor device and a method for manufacturing thereof are provided to avoid deterioration of the tunnel insulating film to increase frequency of writing data on the nonvolatile memory semiconductor device and erasing thereof.

BRIEF DESCRIPTION OF THE DRAWINGS

The above and other objects, advantages and features of the present invention will be more apparent from the following description taken in conjunction with the accompanying drawings, in which.

DESCRIPTIONS OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be presented.

First Embodiment

Figure 1:
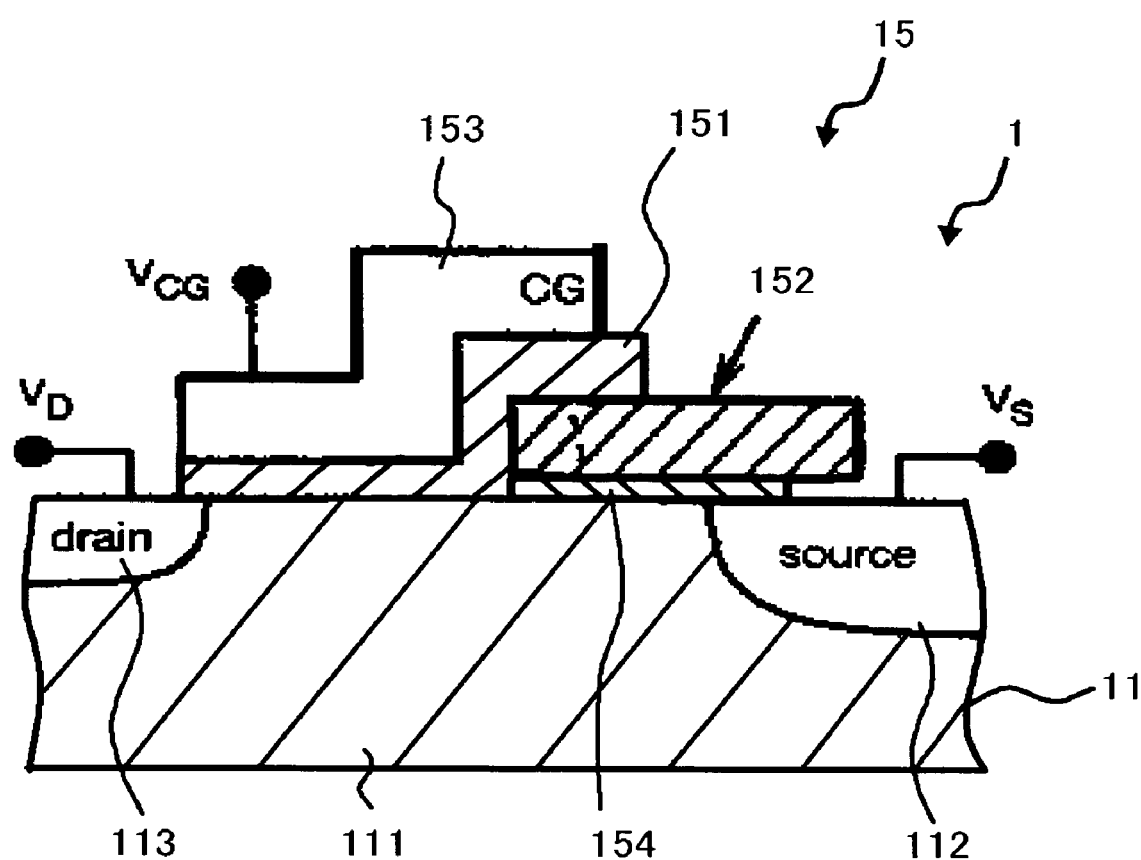
FIG. 1 is a cross-sectional view of a nonvolatile memory semiconductor device according to first embodiment.

A nonvolatile memory semiconductor device 1 of the present embodiment is shown in FIG. 1. The nonvolatile memory semiconductor device 1 includes a silicon substrate 11 composed of a semiconductor substrate and a memory cell 15 disposed on the silicon substrate 11. The memory cell 15 includes a floating gate 152 formed on the silicon substrate 11 through an insulating film 154 therebetween, a tunnel insulating film 151 provided on this floating gate 152 and disposed adjacent to the floating gate 152, and a control gate 153 provided on the tunnel insulating film 151.

A p-type well 111 is formed in the silicon substrate 11 by ion implanting a p-type impurity. In addition, an n-type source region 112 and an n-type drain region 113 are formed a region in the p-type well 111 located in the side of the tunnel insulating film 151.

The tunnel insulating film 151 is disposed between the floating gate 152 and the control gate 153, and provided to contact with the floating gate 152 and the control gate 153. Thickness of the tunnel insulating film 151 is equal to or smaller than 20 nm. In addition to above, the thickness of the tunnel insulating film 151 may be arbitrarily selected provided that the thickness is equal to or smaller than 20 nm, and preferably equal to or smaller than 20 nm, or equal to or larger than 10 nm.

Figure 2:
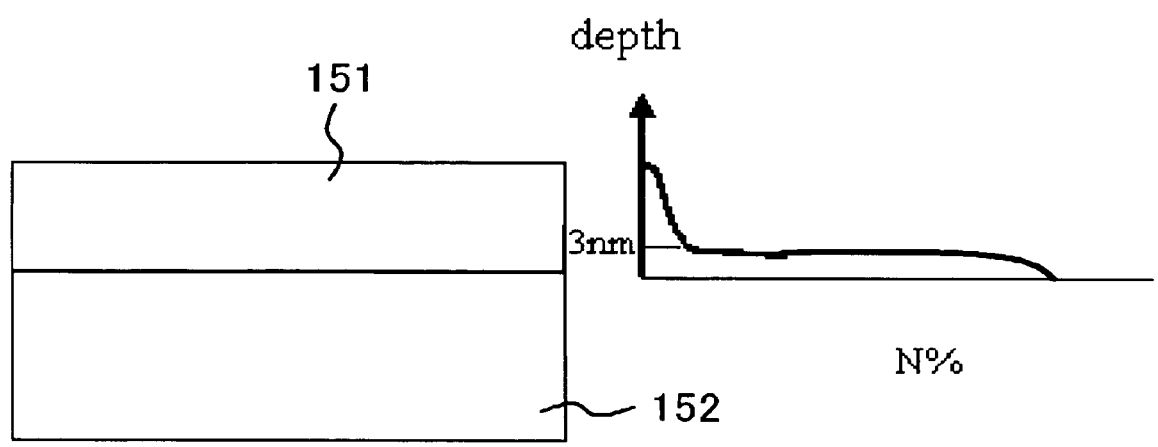
FIG. 2 contains diagrams showing distribution of concentration of atomic nitrogen in the tunnel insulating film of the nonvolatile memory semiconductor device.

Concentration of atomic nitrogen in such tunnel insulating film 151 is 0.1 to 5 atomic %. Such concentration of atomic nitrogen is measured by a nuclear reaction analysis (NRA) or a photoelectron spectroscopy. As shown in FIG. 2, larger amount of atomic nitrogen in the tunnel insulating film 151 is distributed primarily in the interface layer of the tunnel insulating film 151, and concentration of atomic nitrogen in the interface layer (i.e., ratio of atomic nitrogen contained in the interface layer over the whole atom in the interface layer) is 10 times or more higher than concentration of atomic nitrogen in other portion of the tunnel insulating film 151 (i.e., ratio of atomic nitrogen contained in other portions over the whole atom of such other portions). Here, the "whole atom" means atom detected by a nuclear reaction analysis or a photoelectron spectroscopy, and excludes atom of below minimum detectable quantity.

Further, any peak of concentration, which is larger than concentration of atomic nitrogen in the interface layer, is not observed in other portions in the tunnel insulating film 151, and thus concentration of atomic nitrogen in other portions in the tunnel insulating film 151 is equal to or lower than ¹⁄₁₀ of concentration of atomic nitrogen in the interface layer, over the whole range of other portions in the tunnel insulating film 151.

Such concentration distribution is obtained by secondary ion composition analysis method or photoelectron spectroscopy.

Here, the interface layer means a portion extending from a surface of the tunnel insulating film 151 contacting with the floating gate 152 (i.e., surface in the side of the floating gate 152) to the vicinity of the surface (i.e., locations disposed inside of the tunnel insulating film 151 by 3 nm from the surface). In other words, the tunnel insulating film 151 has configured that concentration of atomic nitrogen in the interface layer that contacts with the portion retaining electron in the process of erasing data from the nonvolatile memory semiconductor device 1 (i.e., the portion having higher electronic energy) is 10 times or more higher than concentration of atomic nitrogen in other portions thereof. Further, density per unit area of atomic nitrogen in the surface of the tunnel insulating film 151 contacting with the floating gate 152, which is measured by secondary ion composition analysis method, is equal to or lower than $4\times10^{14}$ atoms/cm$^2$. In addition to above, density per unit area of atomic nitrogen in the surface of the tunnel insulating film 151 contacting with the floating gate 152 may preferably be equal to or lower than $4\times10^{14}$ atoms/cm$^2$ or equal to or higher than $1\times10^{10}$ atoms/cm$^2$.

Such nonvolatile memory semiconductor device 1 is operated as follows. When writing data on the nonvolatile memory semiconductor device 1 is conducted, the silicon substrate 11 is, for example, grounded, and null voltage (0 V) is applied to the n-type source region 112, a positive higher voltage (+12 V) is applied to the n-type drain region 113, and a positive lower voltage (+2 V) is applied to the control gate 153. In this case, electron flowing from the source region 112 into the drain region 113 is injected into the floating gate 152 through the insulating film 154, where electron is tunneled therethrough. This achieves writing data thereon. On the other hand, when data stored on the nonvolatile memory semiconductor device 1 is erased, the silicon substrate 11 is, for example, grounded, and null voltage (0 V) is applied to the source region 112 and the drain region 113, and positive higher voltage (+14 V) is applied to the control gate 153. In this case, electron in the floating gate 152 is drawn to the control gate 153, which is at higher potential, and then Fowler Nordheim (FN)-tunneled through the tunnel insulating film 151, and eventually pulled out to the control gate 153. This achieves erasing data.

Next, a method for manufacturing the nonvolatile memory semiconductor device 1 will be described. First of all, the insulating film 154 is formed on the silicon substrate 11, and thereafter, the floating gate 152 is formed on the insulating film 154. Next, the tunnel insulating film 151 is formed so as to stride over the floating gate 152 and the silicon substrate 11. In this case, concentration of atomic nitrogen in the tunnel insulating film 151 is 0.1 to 5 atomic %, and the tunnel insulating film 151 is formed to have concentration of atomic nitrogen in the interface layer of the tunnel insulating film 151 of 10 times or more higher than concentration of atomic nitrogen in other portions except the interface layer of the tunnel insulating film 151.

More specifically, a CVD oxide film having a thickness of 20 nm is formed via a chemical vapor deposition process that employs dichlorosilane ($SiH_2Cl_2$) and $N_2O$ gas as source gases. Next, a nitrogen annealing of the CVD oxide film is conducted within an $N_2O$ gas atmosphere at a temperature within a range of from 950 degree C. to 1,200 degree C. In this case, a lamp-annealing is conducted. This configuration provides forming the tunnel insulating film 151. Thereafter, the control gate 153 is formed on the tunnel insulating film 151.

When the tunnel insulating film 151 is formed, the CVD oxide film is formed and the formed CVD oxide film is nitrogen-annealed within the $N_2O$ gas atmosphere at the temperature within the range of from 950 degree C. to 1,200 degree C., such that the tunnel insulating film 151 having concentration of atomic nitrogen in the interface layer of 10 times or more higher than concentration of atomic nitrogen in other portions of the tunnel insulating film 151 is obtained. In addition to above, if the temperature for the nitrogen-annealing process is higher than 1,200 degree C., the CVD oxide film may possibly be degraded. On the contrary, if the temperature for the nitrogen-annealing process is lower than 950 degree C., it is difficult to form the tunnel insulating film 151 having concentration of atomic nitrogen in the interface layer of 10 times or more higher than concentration of atomic nitrogen in other portions of the tunnel insulating film 151.

Here, the present inventors has considered that the deterioration of the tunnel insulating film 151 is induced by the influence of binding conditions of atomic nitrogen existing in the interface layer of the tunnel insulating film 151, in addition to the distribution of nitrogen concentration. Consequently, investigations on binding conditions of atomic nitrogen existing in the tunnel insulating film 151, which is manufactured by the manufacturing method as described above, were made.

Following five binding conditions are known as binding conditions of atomic nitrogen existing in a silicon oxide film containing nitrogen. Descriptions will be made in reference to FIG. 3 and FIG. 4. Binding conditions of atomic nitrogen include:

first binding condition, in which all of three first proximal atom directly bonded to nitrogen atom are silicon (Si) atom, and second proximal atom bonded to Si atom are N atom or Si atom (hereinafter referred to as binding condition N1); second binding condition, in which all of first proximal atom directly bonded to nitrogen atom are silicon (Si) atom, and second proximal atom bonded to Si atom include one or more oxygen atom(s) (hereinafter referred to as binding condition N2); third binding condition, in which two of first proximal atom directly bonded to nitrogen atom are silicon (Si) atom, and one thereof is oxygen (O) atom (hereinafter referred to as binding condition N3); fourth binding condition, in which one of first proximal atom directly bonded to nitrogen atom are silicon (Si) atom, and two thereof are oxygen (O) atom (hereinafter referred to as binding condition N4); and fifth binding condition, in which all of first proximal atom directly bonded to nitrogen atom are oxygen (O) atom, exists on said interface layer (hereinafter referred to as binding condition N5).

In order to confirm the presences of atomic nitrogen in binding condition N1 to N5 in the interface layer of the tunnel insulating film 151, estimations on photoelectron spectroscopy spectrum of the tunnel insulating film 151 are required. First of all, the surface of the tunnel insulating film 151 was etched with hydrofluoric acid (HF) to form a sample specimen having a thickness of 3 nm. Such sample specimen was disposed in an ultra-high-vacuum vessel, and then the surface of the sample specimen is irradiated with x-ray, while intensity of N1s photoelectron excited by x-ray (binding energy=397.9 eV) is detected from a direction perpendicular to the surface. Photoelectron spectroscopy spectrum determined by such procedure is shown in FIG. 5.

Figure 4:
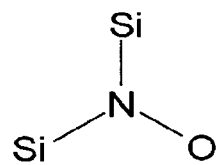
FIG. 4 contains chemical structure, showing binding condition of atomic nitrogen in the tunnel insulating film.
Figure 4:
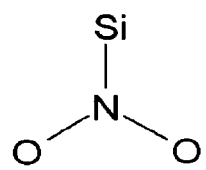
Figure 4:
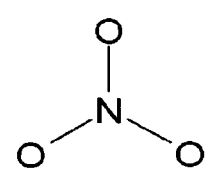
Figure 5:
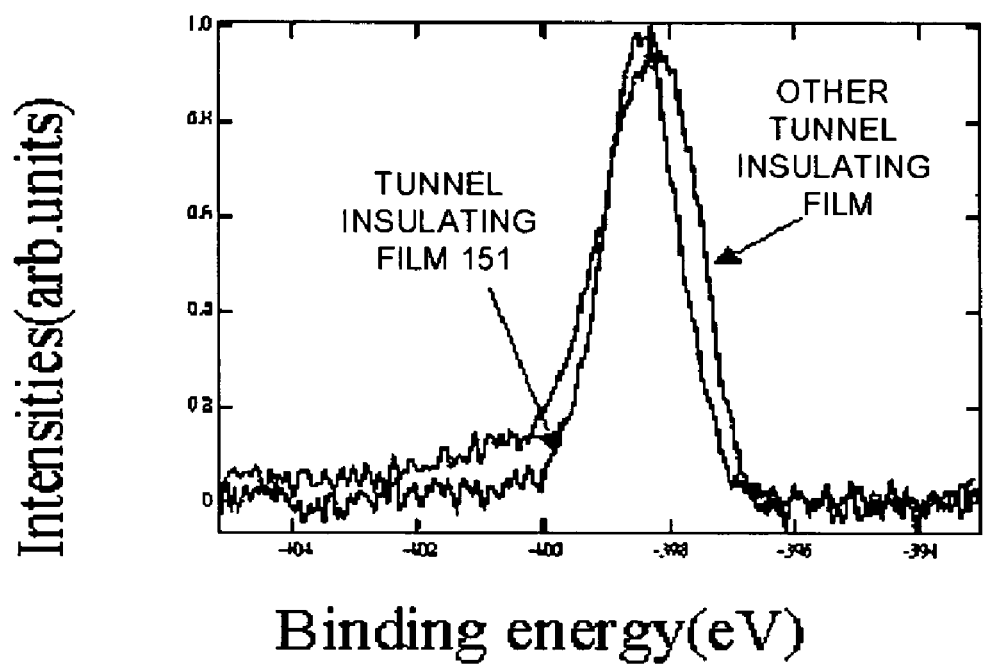
FIG. 5 is a graph, showing a photoelectron spectroscopy spectrum of a tunnel insulating film and other tunnel insulating film.
Figure 6A:
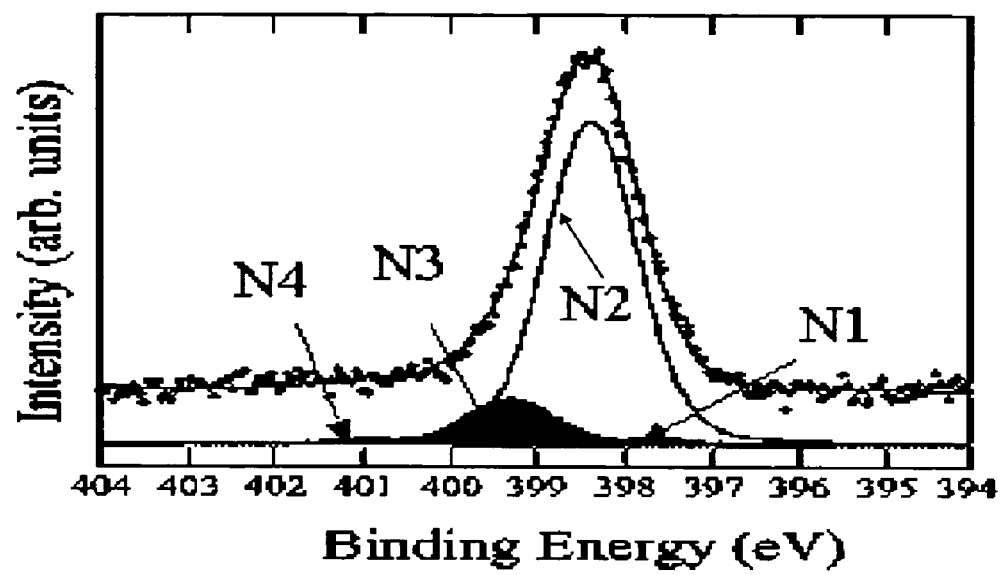
FIG. 6A is a graph, showing a spectrum fitted with a photoelectron spectroscopy spectrum of the tunnel insulating film.

Next, peak appeared in the photoelectron spectroscopy spectrum shown in FIG. 5 was fitted by Voigt function. The photoelectron spectroscopy spectrum generally obtained by the photoelectron spectroscopy includes a type of spectrum having a single peak, and a type of spectrum composed of sum of a plurality of peaks exhibiting similar binding energies. If the obtained spectrum can not be fitted to a spectrum having single peak, the obtained spectrum is then fitted to a spectrum having a plurality of peaks, and the most smartly fitted result is assumed to be original spectrum. In this case, it was assumed that peaks exist in positions corresponding to binding energies of atomic nitrogen in respective five binding conditions described above, and the intensity of each peak was determined via a least squares method. In the present embodiment, fitting the spectrum can be achieved by splitting a peak appeared in FIG. 5 into four peaks as shown in FIG. 6A. As shown in FIG. 6A, four peaks are found at positions of binding energies (Eb) shifted by 0 eV, 0.7 eV, 1.8 eV and 3.2 eV from (Eb)=397.7 eV. These peaks correspond to binding conditions N1 to N4 shown in FIG. 3 and FIG. 4, and it can be understood that atomic nitrogen in four binding conditions coexist in the sample specimen having a thickness of 3 nm, or more specifically, in the interface layer of the tunnel insulating film 151.

Further, as shown in FIG. 6A, in the sample specimen having a thickness of 3 nm, or more specifically, in the interface layer of the tunnel insulating film 151, it is concluded that concentration of atomic nitrogen in binding condition N2 is twice or more of concentration of atomic nitrogen in binding condition N1. Further, it can be understood that substantially no atomic nitrogen in binding condition N5 exists in the interface layer of the tunnel insulating film 151. Here, "substantially no atomic nitrogen in binding condition N5 exists" means that the peak corresponding to atomic nitrogen in binding condition N5 is lower than minimum detectable quantity. In addition to above, substantially no atomic nitrogen in binding condition N5 also exists in the entire tunnel insulating film 151 in the present embodiment. More specifically, concentration of atomic nitrogen in binding condition N5 is lower than minimum detectable quantity by the photoelectron spectroscopy.

Next, distribution of atomic nitrogen in binding conditions N1 to N4 in the interface layer of the tunnel insulating film 151 was evaluated. The distribution of atomic nitrogen in binding conditions N1 to N4 may be confirmed by measuring intensities of N1s photoelectron from different detecting angles for N1s photoelectron in the interface layer of the tunnel insulating film 151. Alternatively, the interface layer of tunnel insulating film 151 may be etched with HF, and the etched sample specimen having different thickness may be irradiated with x-ray, and then photoelectron from a direction perpendicular to the surface thereof may be measured to confirm the distribution of atomic nitrogen in binding conditions N1 to N4.

Figure 7A:
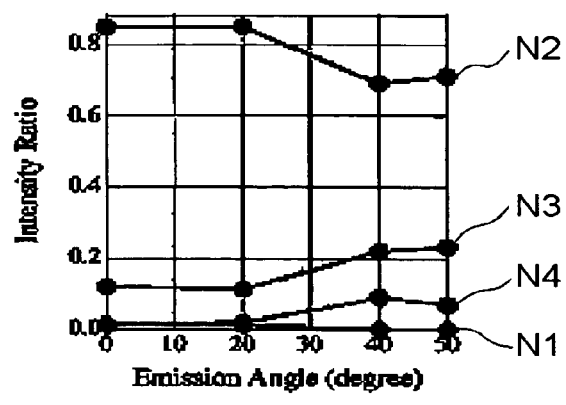
FIG. 7A is a graph, showing photoelectron intensity of N1s detected by selecting different angles of the tunnel insulating film.

FIG. 7A is a graph, showing intensities of photoelectron N1s detected from different detecting angles. In this case, the surface of the tunnel insulating film 151 was etched with HF to obtain a sample specimen having a thickness of 3 nm (interface layer of the tunnel insulating film 151), and the obtained sample specimen was employed. In FIG. 7A, larger detecting angle presents a detection in a location closer to the surface of the sample specimen (the side of the surface opposing to the surface contacting with the floating gate 152 in the interface layers of the tunnel insulating film 151). Tendency can be read from FIG. 7A, in which larger detecting angle presents reduced intensity of the peak for nitrogen in binding condition N2 and higher intensities of the peaks corresponding binding conditions N3 and N4.

It can be understood that amount of atomic nitrogen in binding condition N2 is reduced in the surface opposing to the surface contacting with the floating gate 152 in the interface layer of the tunnel insulating film 151, although larger amount of atomic nitrogen in binding condition N2 exist in the interface layer. Further, it is also shown that larger amount of atomic nitrogen in binding conditions N3 and N4 in the interface layer of the tunnel insulating film 151 is distributed in the side of the surface opposing to the surface contacting with the floating gate 152 in the interface layer of the tunnel insulating film 151.

Figure 8A:
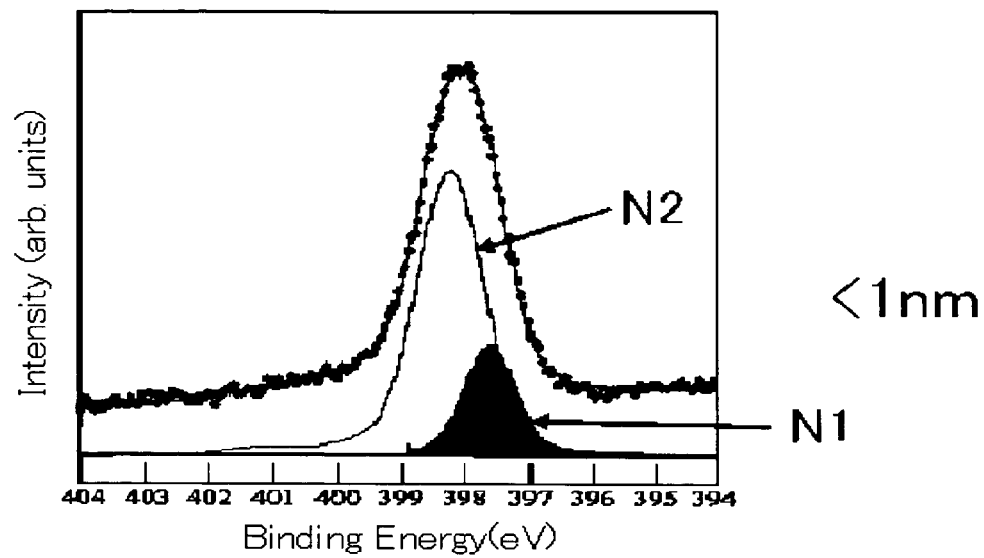
FIG. 8A is a graph, showing photoelectron spectroscopy spectrum of a sample specimen, which is manufactured by etching the tunnel insulating film to have a film thickness of smaller than 1 nm.

Further, a spectrum is shown in FIG. 8A, which was obtained by the procedure, in which the surface of the tunnel insulating film 151 was etched with HF, and the obtained sample specimen having a film thickness of smaller than 1 nm is irradiated with x-ray, and then excited photoelectron was measured from a direction perpendicular to the surface thereof. As shown in FIG. 8A, higher ratio of peak intensity for atomic nitrogen in binding condition N1 to peak intensity of atomic nitrogen in binding condition N2 is presented for the sample specimen having a film thickness of smaller than 1 nm, as compared with the sample specimen having a film thickness of 3 mm (see FIG. 6A). This indicates that atomic nitrogen in binding condition N1 exists in the side of the surface contacting with the floating gate 152 of the tunnel insulating film 151.

Figure 9A:
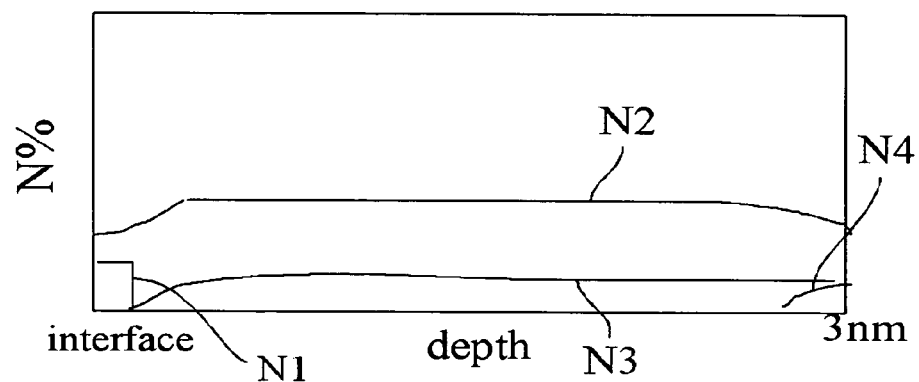
FIG. 9A is a schematic diagram, showing distribution of atomic nitrogen in binding conditions N1 to N4 in the interface layer of the tunnel insulating film.

Next, distribution of atomic nitrogen in binding conditions N1 to N4 in the interface layer of the tunnel insulating film 151 is shown in FIG. 9A. FIG. 9A is a graph, presenting an estimation of distribution of atomic nitrogen in binding conditions N1 to N4 contained in the interface layer of the tunnel insulating film 151 obtained by analyzing FIG. 6A, FIG. 7A and FIG. 8A. The left side of FIG. 9A corresponds to a side of the surface of the tunnel insulating film 151 contacting with the floating gate 152, and the right side of FIG. 9A corresponds to the interior side of the tunnel insulating film 151. It is understood that atomic nitrogen in binding condition N1 exists in the surface of the tunnel insulating film 151 contacting with the floating gate 152. Atomic nitrogen in binding condition N2 is broadly distributed over the entire interface layer of the tunnel insulating film 151. Further, only atomic nitrogen in binding condition N2 and atomic nitrogen in binding condition N1 substantially exist in the surface of the tunnel insulating film 151 contacting with the floating gate 152. Here, "only atomic nitrogen in binding condition N2 and atomic nitrogen in binding condition N1 substantially exist in the surface of the tunnel insulating film 151 contacting with the floating gate 152" means that density of atomic nitrogen in binding conditions N3 to N5 is lower than minimum detectable quantity in the aforementioned surface, and thus is not detected. Atomic nitrogen in binding condition N4 exists only in the locations remote by 2 nm or further from the surface of the tunnel insulating film 151 contacting with the floating gate 152. Further, it is estimated that the ratios of atomic nitrogen in respective binding conditions N1 to N4 in the interface layer of the tunnel insulating film 151 are: equal to or lower than 20% of atomic nitrogen in binding condition N1; equal to or lower than 5% of atomic nitrogen in binding condition N3; equal to or lower than 5% of atomic nitrogen in binding condition N4, and rest of the atomic nitrogen in binding condition N2. Further, it is also estimated that concentration of atomic nitrogen in the interface layer of the tunnel insulating film 151 is equal to or lower than 1 atomic %.

Next, binding conditions of atomic nitrogen in other tunnel insulating films other than the tunnel insulating film 151 was investigated. While concentrations of atomic nitrogen in other tunnel insulating films are 0.1 to 5 atomic %, concentration of atomic nitrogen in the interface layer of other tunnel insulating film is 10 times or less higher than concentration of atomic nitrogen in other portions of the other tunnel insulating film except the interface layer. Such other tunnel insulating film was obtained by forming a CVD oxide film having a thickness of equal to or smaller than 20 nm on the silicon substrate via a chemical vapor deposition employing source gases of monosilane and $N_2O$ gas and then by nitrogen-annealing thereof within an atmosphere of NO gas at a temperature of around 800 degree C. The aforementioned nitrogen-annealing process was conducted in an electric furnace.

Figure 6B:
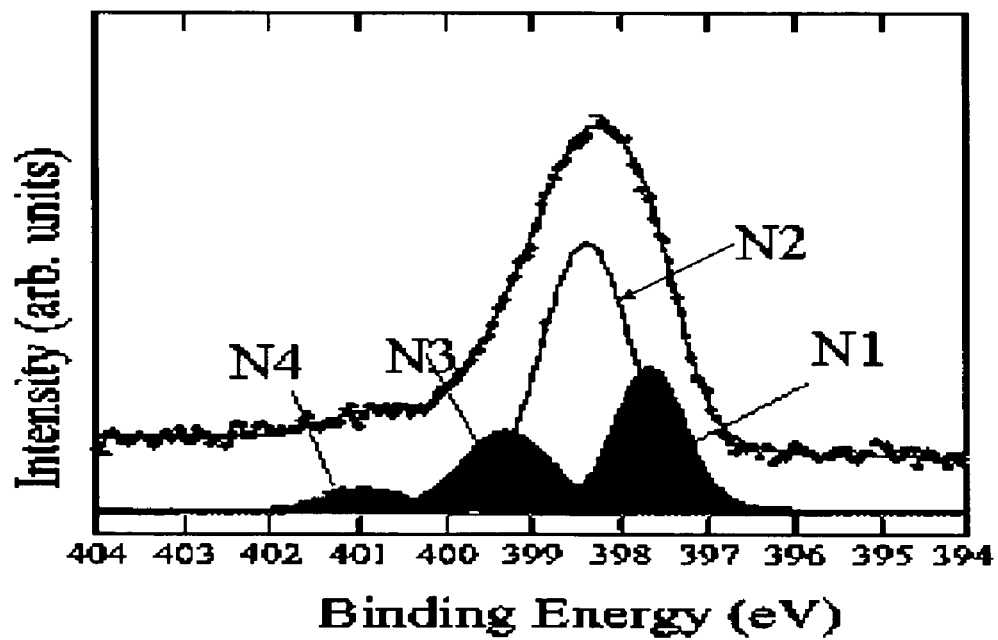
FIG. 6B is a graph, showing a spectrum fitted with a photoelectron spectroscopy spectrum of other tunnel insulating film.

First of all, a method similar to that employed for the tunnel insulating film 151 was employed to obtain a photoelectron spectroscopy spectrum for the interface layer of other tunnel insulating film, and the obtained spectrum was fitted to have a plurality of peaks. Results are shown in FIG. 5 and FIG. 6B. It can be understood that, amount of atomic nitrogen in binding condition N1, in binding condition N3 and in binding condition N4 is larger in the interface layer of other tunnel insulating film than in the interface layer of the tunnel insulating film 151.

In general, atomic nitrogen in binding condition N3 and binding condition N4 is difficult to be generated in the interface layer. Since amount of atomic nitrogen in binding condition N3 and binding condition N4 in the interface layer, where atomic nitrogen in binding condition N3 and binding condition N4 is otherwise difficult to be generated, is larger than in the interface layer of the tunnel insulating film 151, it is also expected that, in other portion except the interface layer, amount of atomic nitrogen in binding condition N3 and binding condition N4 contained in other tunnel insulating film is larger than that contained in the tunnel insulating film 151. Further, although it is not shown here, concentration of atomic nitrogen in binding condition N3 and in binding condition N4 contained in other portion except the interface layer of other tunnel insulating film was confirmed, and the results show that the confirmed concentration thereof is higher than concentration of atomic nitrogen in binding condition N3 and in binding condition N4 in other portion of the tunnel insulating film except the interface layer 151. More specifically, larger amount of atomic nitrogen in binding condition N3 and in binding condition N4 exists in the entire other tunnel insulating film than in the tunnel insulating film 151.

Figure 7B:
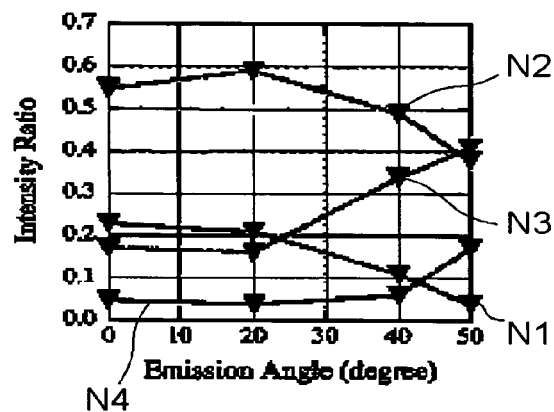
FIG. 7B is a graph, showing photoelectron intensity of N1s detected by selecting different angles of other tunnel insulating film.

Next, distribution of atomic nitrogen in binding conditions N1 to N4 in the interface layer of other tunnel insulating film is investigated by a method similar to that employed for the tunnel insulating film 151. N1s photoelectron intensity was measured by selecting different detecting angles for N1s photoelectron in other tunnel insulating films. Results are shown in FIG. 7B. Further, the surface of other tunnel insulating film was etched with HF, and the etched sample specimen having a film thickness of smaller than 1 nm was irradiated with x-ray. Then, excited photoelectron was measured from a direction perpendicular to the surface thereof. Spectrum thus obtained is shown in FIG. 8B.

Figure 8B:
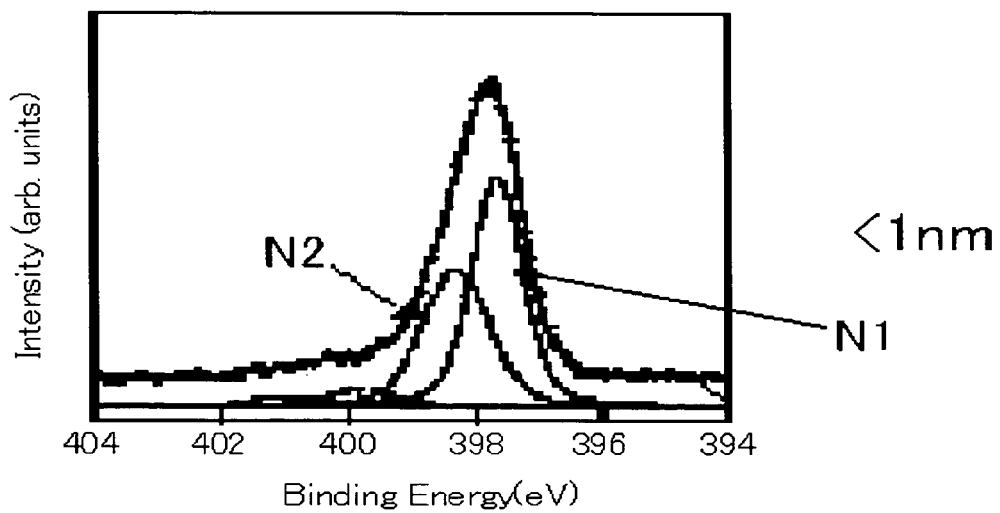
FIG. 8B is a graph, showing photoelectron spectroscopy spectrum of a sample specimen, which is manufactured by etching other tunnel insulating film to have a film thickness of smaller than 1 nm.

As show in FIG. 8B, the sample specimen having a film thickness of lower than 1 nm exhibits a peak intensity of atomic nitrogen in binding condition N1, which is stronger than a peak intensity of atomic nitrogen in binding condition N2, and therefore it can be understood that amount of atomic nitrogen of binding condition N1 is larger than amount of atomic nitrogen in binding condition N2 in the side of the surface contacting with the floating gate of other tunnel insulating film. Further, it is also understood that larger amount of atomic nitrogen in binding condition N1 exists in the side of the surface contacting with the floating gate in other tunnel insulating film, as compared with the tunnel insulating film 151.

Figure 9B:
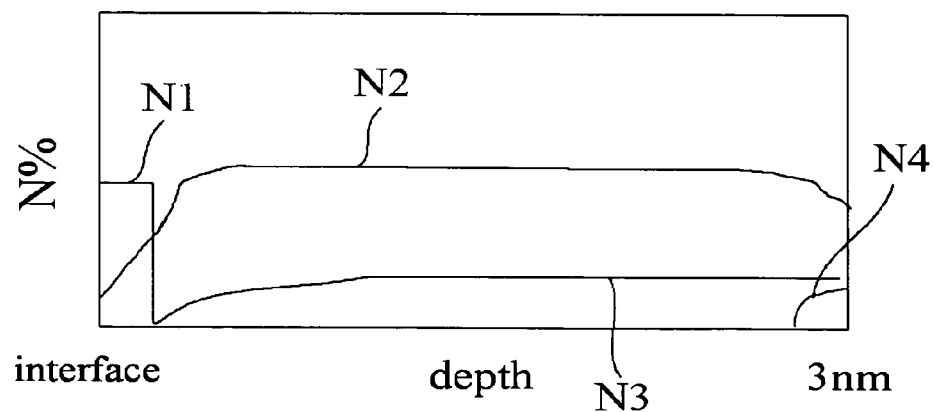
FIG. 9B is a schematic diagram, showing distribution of atomic nitrogen in binding conditions N1 to N4 in the interface layer of other tunnel insulating film.

Distribution of atomic nitrogen in binding condition N1 to N4 contained in the interface layer of other tunnel insulating films is shown in FIG. 9B. FIG. 9B is a graph, presenting an estimation of distribution of atomic nitrogen in binding conditions N1 to N4 contained in the interface layer of other tunnel insulating film obtained by analyzing FIG. 6B, FIG. 7B and FIG. 8B. The left side of FIG. 9B corresponds to a side of the surface of other tunnel insulating film contacting with the floating gate, and the right side of FIG. 9B corresponds to the interior side of other tunnel insulating film. It is understood that amount of atomic nitrogen in binding condition N1 in the interface layer of other tunnel insulating film is larger than that in the interface layer of the tunnel insulating film 151. Further, it is also understood that density of atomic nitrogen in binding condition N1 in the surface of other tunnel insulating film contacting with the floating gate is larger than density of atomic nitrogen in binding condition N1 in the surface of the tunnel insulating film 151 contacting with the floating gate 152.

Figure 10:
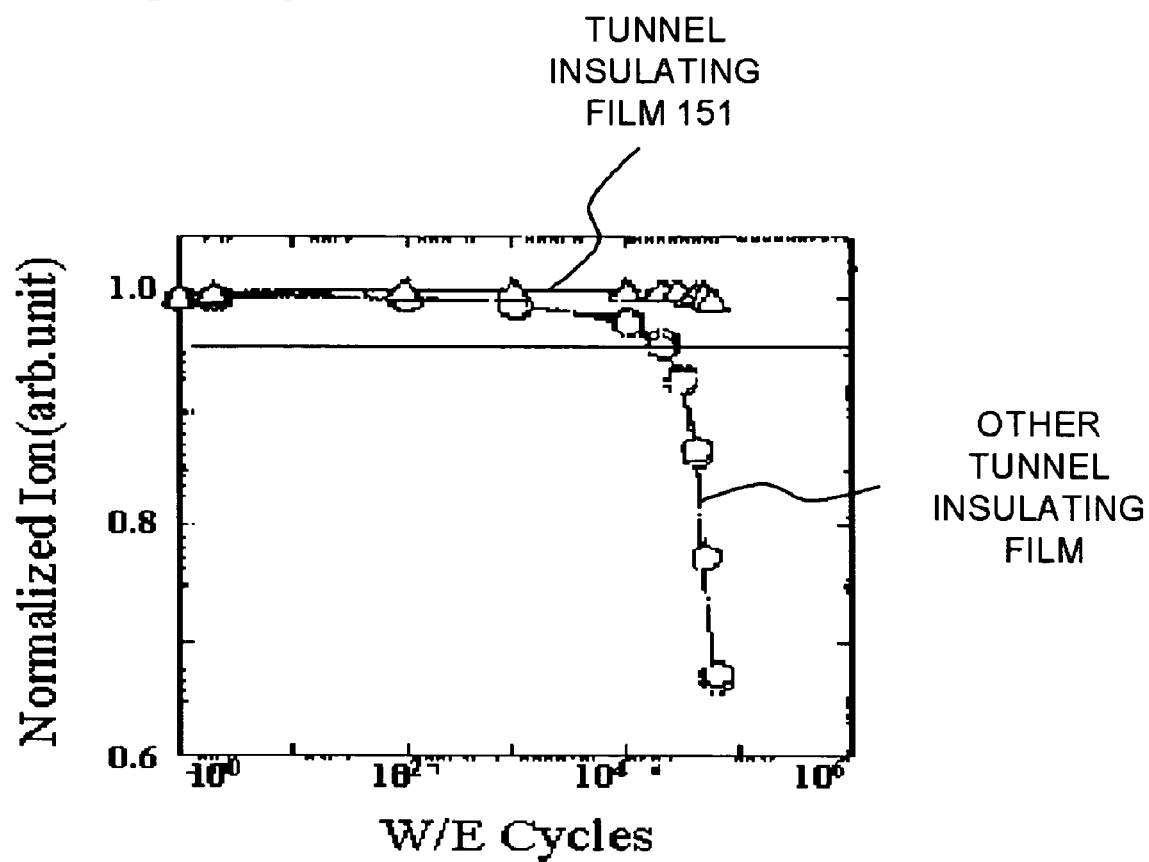
FIG. 10 is a graph, showing a relationship of a decrease in the tunneling current over frequency of writing data on and erasing data from a nonvolatile memory semiconductor device.

Next, investigations on frequency of writing data on and erasing data stored in the nonvolatile memory semiconductor device 1 employing the tunnel insulating film 151 as described above and investigations on frequency of writing data on and erasing data stored in the nonvolatile memory semiconductor device employing other tunnel insulating film were made. In addition to above, the configuration of the nonvolatile memory semiconductor device employing other tunnel insulating film is same as the configuration of the nonvolatile memory semiconductor device 1, except that the tunnel insulating film is different. While the tunneling current through the nonvolatile memory semiconductor device employing other tunnel insulating film is rapidly decreased and the life time thereof is about 10,000 operations as shown in FIG. 10, a decrease in the tunneling current through the nonvolatile memory semiconductor device 1 employing the tunnel insulating film 151 is small, and the life time thereof is 10 times or more longer than that of the nonvolatile memory semiconductor device employing other tunnel insulating film.

Next, advantageous effects obtainable by employing the nonvolatile memory semiconductor device 1 will be described as follows. Since the nonvolatile memory semiconductor device 1 according to the present invention employs the configuration, in which concentration of atomic nitrogen in the tunnel insulating film 151 is within a range of from 0.1 to 5 atomic %, and concentration of atomic nitrogen in the narrow area (interface layer) extending from the surface of the tunnel insulating film 151 contacting with the floating gate 152 to the vicinity of the surface is higher than concentration of atomic nitrogen in the portions other than the tunnel insulating film 151, a trap site for electron is difficult to be created, and therefore deterioration of the tunnel insulating film 151 can be prevented. Effects in preventing the deterioration of the tunnel insulating film created by selecting concentration of atomic nitrogen in the interface layer of the tunnel insulating film 151 to be higher than concentration of atomic nitrogen in the portions other than the tunnel insulating film 151 becomes to be more considerable, by selecting concentration of atomic nitrogen in the interface layer of the tunnel insulating film 151 to be 10 times or more higher than concentration of atomic nitrogen in other portions. This is clear from the fact that no effect of preventing deterioration of the tunnel insulating film is created in the tunnel insulating film having concentration of atomic nitrogen in the interface layer that is less than 10 times higher than concentration of atomic nitrogen in other portions.

In addition to above, experiments conducted by the present inventors also clarified that advantageous effect of preventing generation of trap site for electron by doping nitrogen was not obtained, when concentration of atomic nitrogen in the tunnel insulating film was lower than 0.1 atomic %. On the contrary, when concentration of atomic nitrogen in the tunnel insulating film is higher than 5 atomic %, it is considered that concentration of atomic nitrogen in the surface contacting with the floating gate of the tunnel insulating film is increased, and it was found that the surface contacting with the floating gate of the tunnel insulating film is roughened, leading to decreasing flow of on-state current.

Further, atomic nitrogen in binding conditions N1 and N2 is mainly generated in the interface layer of the tunnel insulating film 151, and atomic nitrogen in binding conditions N3 and N4 is hard to be generated. On the other hand, atomic nitrogen in binding conditions N3 and N4 is easily generated in the portion of the tunnel insulating film 151 inner than the interface layer.

Therefore, concentration of atomic nitrogen in the interface layer is increased and concentration of atomic nitrogen in other portions except the interface layer is decreased, or more specifically, concentration of atomic nitrogen in the interface layer is selected to be 10 times or more higher than concentration of atomic nitrogen in other portions except the interface, so that concentration of atomic nitrogen in binding conditions N3 and N4 in the entire tunnel insulating film 151 can be reduced. In molecular of a structure having atomic nitrogen in binding conditions N3 and N4 (shown in FIG. 4), N—O polarization is created since electron affinity of atomic oxygen (O) is different from that of atomic nitrogen (N), thereby creating a charge trapping site. Accordingly, it is expected that deterioration of tunnel insulating film 151 can be prevented by reducing amount of atomic nitrogen in binding conditions N3 and N4 in the entire tunnel insulating film 151. This can be also clear by the fact that other tunnel insulating films containing larger amount of atomic nitrogen in binding conditions N3 and N4 than the tunnel insulating film 151 was easily deteriorated. Further, when concentration of atomic nitrogen in binding conditions N3 and N4 is increased in the tunnel insulating film, such atomic nitrogen is accumulated in the floating gate, and electron that should be retained in the floating gate is easily leaked through the tunnel insulating film. In other words, since the insulation of the tunnel insulating film is deteriorated, concentration of atomic nitrogen in the interface layer is increased and concentration of atomic nitrogen in other portions except the interface layer is decreased as in the present embodiment, so that the insulation of the tunnel insulating film 151 can be improved.

Further, since atomic nitrogen contained in the interface layer of the tunnel insulating film 151 in the nonvolatile memory semiconductor device 1 is in binding conditions N1 to N4 and substantially no atomic nitrogen in binding condition N5 is contained, deterioration of the tunnel insulating film 151 can be surely prevented. In molecular of a structure having atomic nitrogen in binding condition N5 (shown in FIG. 4), N—O polarization is created since electron affinity of atomic oxygen (O) is different from that of atomic nitrogen (N), thereby creating a charge trapping site. Since all of the first proximal atom for atomic nitrogen in binding condition N5 are atomic oxygen (O), level of N—O polarization created in molecular of the structure having atomic nitrogen in binding condition N5 is higher than that created in molecular of the structure having atomic nitrogen in binding conditions N3 and N4. Therefore, deterioration of the tunnel insulating film 151 can be surely prevented by containing substantially no atomic nitrogen in binding condition N5 in the interface layer, and therefore it is considered that an increase in frequency of writing data on and erasing data stored in the nonvolatile memory semiconductor device 1 can be attempted. Further, since substantially no atomic nitrogen in binding condition N5 is contained not only in the interface layer of the tunnel insulating film 151 but also in the entire tunnel insulating film 151, prevention of deteriorating the tunnel insulating film 151 can be more surely achieved.

Further, in the present embodiment, concentration of atomic nitrogen in the interface layer of the tunnel insulating film 151 is selected to be equal to or lower than 1 atomic %, and concentration of atomic nitrogen in binding condition N2 in the interface layer of the tunnel insulating film 151 is selected to be equal to or higher than twice of concentration of atomic nitrogen in binding condition N1. Concentration of all atomic nitrogen in the interface layer of the tunnel insulating film 151 is limited within the predetermined range and concentration of atomic nitrogen in binding condition N1 is reduced and concentration of atomic nitrogen in binding condition N2 is increased, so that deterioration of the tunnel insulating film 151 can be surely prevented and an increase in frequency of writing data on and erasing data stored in the nonvolatile memory semiconductor device 1 can be surely attempted.

Figure 3:
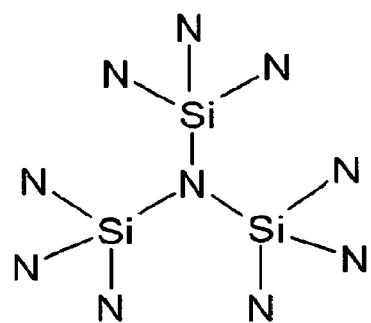
FIG. 3 contains chemical structure, showing binding condition of atomic nitrogen in the tunnel insulating film.
Figure 3:
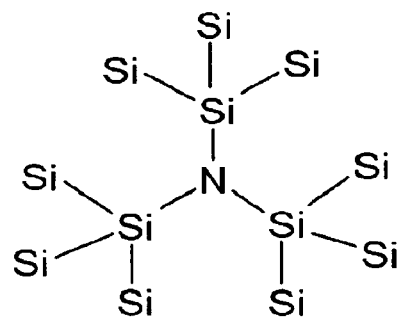
Figure 3:
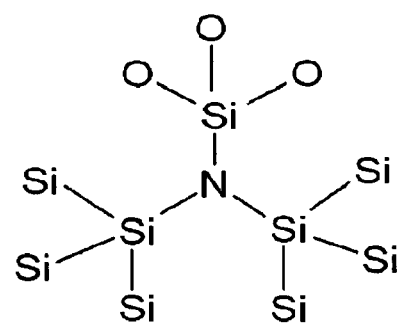
Figure 3:
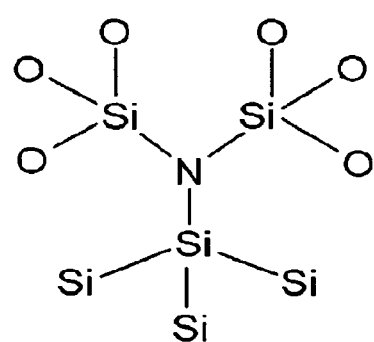
Figure 3:
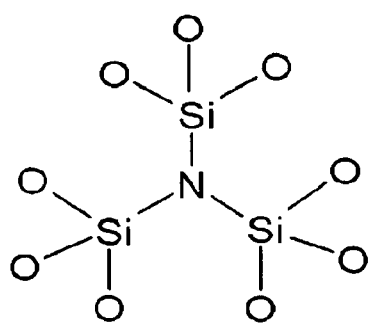

Here, prevention of deterioration of the tunnel insulating film 151 achieved by decreasing concentration of atomic nitrogen in binding condition N1 in the interface layer of the tunnel insulating film 151 will be described in detail. Atomic nitrogen in binding condition N1 is shown in FIG. 3, and since molecular of structure shown in upper side of FIG. 3 contains larger number of atomic nitrogen, stress concentrates on a limited part. In order to relax such stress, atomic nitrogen in binding condition N1 is eliminated, thereby easily creating hole of N (i.e., Si—Si bond). Cleavage of such weak Si—Si bond is occurred under a stress of tunneling current, thereby creating a trap site for electron. Then, for example, electron is trapped as illustrated in the following formula.

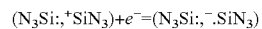

Accordingly, it is considered that concentration of atomic nitrogen in binding condition N1 in the interface layer of the tunnel insulating film 151 is decreased to reduce precursor of trap site for electron, resulting in an increase in frequency of writing data on and erasing data stored in the nonvolatile memory semiconductor device 1.

In addition to above, since hole of nitrogen (N) is difficult to be generated in case of atomic nitrogen in binding condition N2, the tunnel insulating film 151 is not be deteriorated even if concentration of atomic nitrogen in binding condition N2 is higher in tunnel insulating film 151.

In addition to above, concentration of atomic nitrogen in binding condition N1 in the interface layer of other tunnel insulating film is higher than concentration of atomic nitrogen in binding condition N1 in the interface layer of the tunnel insulating film 151. In addition, concentration of atomic nitrogen in binding condition N3 and concentration of atomic nitrogen in binding condition N4 in other tunnel insulating film is higher than that in the tunnel insulating film 151. Therefore, it is considered that other tunnel insulating film is more easily be deteriorated than the tunnel insulating film 151.

Next, differences of the tunnel insulating film 151 of the present embodiment from the tunnel insulating film described in Japanese Patent Laid-Open No. 2001-338,997 will be described.

In the technology described in the tunnel insulating film described in Japanese Patent Laid-Open No. 2001-338,997, a surface of a silicon substrate is oxidized to form a thermal oxidation film of silicon. Then, such thermal oxidation film is oxynitride-treated to form a tunnel insulating film. Therefore, film quality is different between the tunnel insulating film 151 formed by a chemical vapor deposition of the present embodiment and the tunnel insulating film described in Japanese Patent Laid-Open No. 2001-338,997. Densities of a CVD oxide film formed by chemical vapor deposition process and a thermal oxidation film of Japanese Patent Laid-Open No. 2001-338,997 were measured by a X-ray reflectivity. While density of the CVD oxide film is within a range of from 2.12 to 2.17 g/cm$^3$, the thermal oxidation film of Japanese Patent Laid-Open No. 2001-338,997 is higher than the density of the CVD oxide film, and, for example, is about 2.24 g/cm$^3$.

Figure 11:
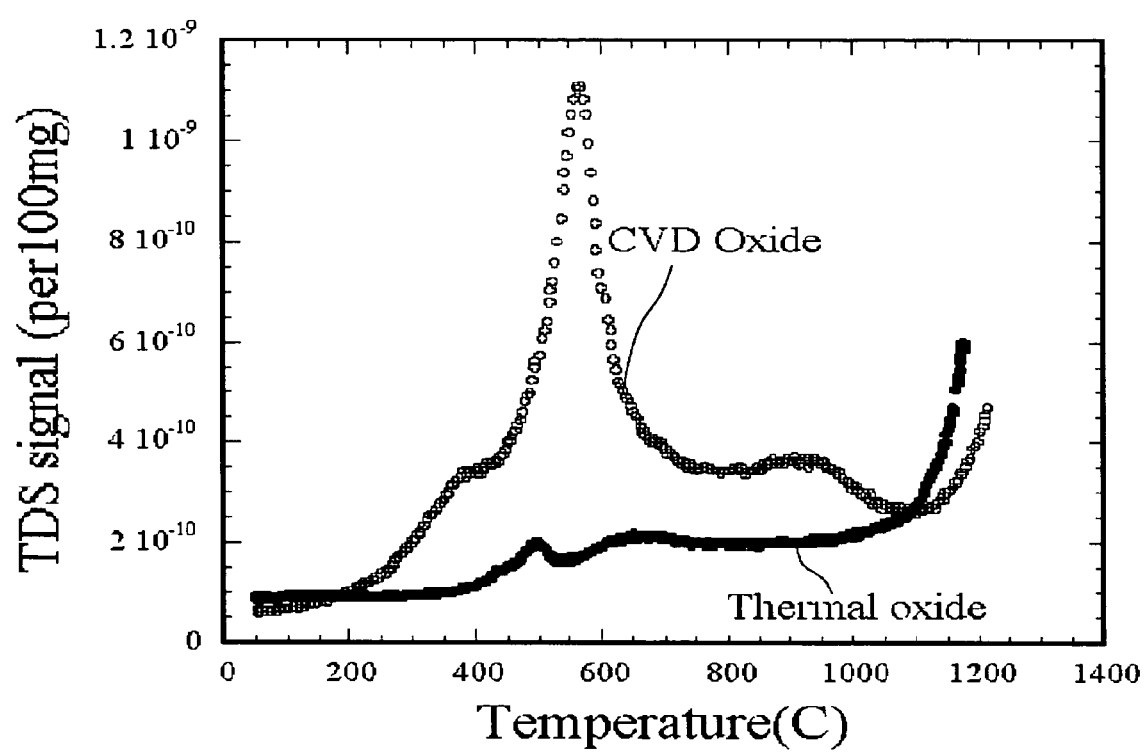
FIG. 11 is a graph, showing a thermal desorption spectrum of atomic hydrogen from a thermal oxidation film and a thermal desorption spectrum of atomic hydrogen from a CVD oxide film.

Possible cause of such difference in the density is a difference of density of atomic hydrogen in the films. FIG. 11 is a graph of data clarifying such difference. It can be seen from a comparison of a thermal desorption spectrum of atomic hydrogen in the thermal oxidation film with a thermal desorption spectrum of atomic hydrogen in the CVD oxide film shown in FIG. 11 that amount of eliminating hydrogen from CVD oxide film is larger than that from the thermal oxidation film, and that the spectrum of the CVD oxide film has a peak of eliminating hydrogen at a temperature around 900 degree C. to 950 degree C. while the spectrum of the thermal oxidation film has no clear peak. Taking these points into consideration, it can be understood that the film quality of the CVD oxide film is different from that of the thermal oxidation film.

It is also considered that the thermal processing conducted at a temperature of equal to or higher than 950 degree C. causes an elimination of atomic hydrogen from the CVD oxide film and also simultaneously causes an introduction of atomic nitrogen into the CVD oxide film in place of such eliminated atomic hydrogen, such that concentration of atomic nitrogen in the interface layer of the tunnel insulating film 151 is 10 times or more higher than concentration of atomic nitrogen in other portions except the tunnel insulating film 151. On the other hand, it is considered that, since amount of eliminating atomic hydrogen from the thermal oxidation film described in Japanese Patent Laid-Open No. 2001-338,997 is smaller, atomic nitrogen is difficult to be entered into the thermal oxidation film, and therefore concentration of atomic nitrogen in the interface layer of the tunnel insulating film described in Japanese Patent Laid-Open No. 2001-338,997 is not 10 times or more higher than concentration of atomic nitrogen in other portions except the tunnel insulating film. Therefore, it is supposed that it is difficult to increase frequency of writing data on and erase data stored in the nonvolatile memory semiconductor device in the tunnel insulating film described in Japanese Patent Laid-Open No. 2001-338,997.

Second Embodiment

Figure 12:
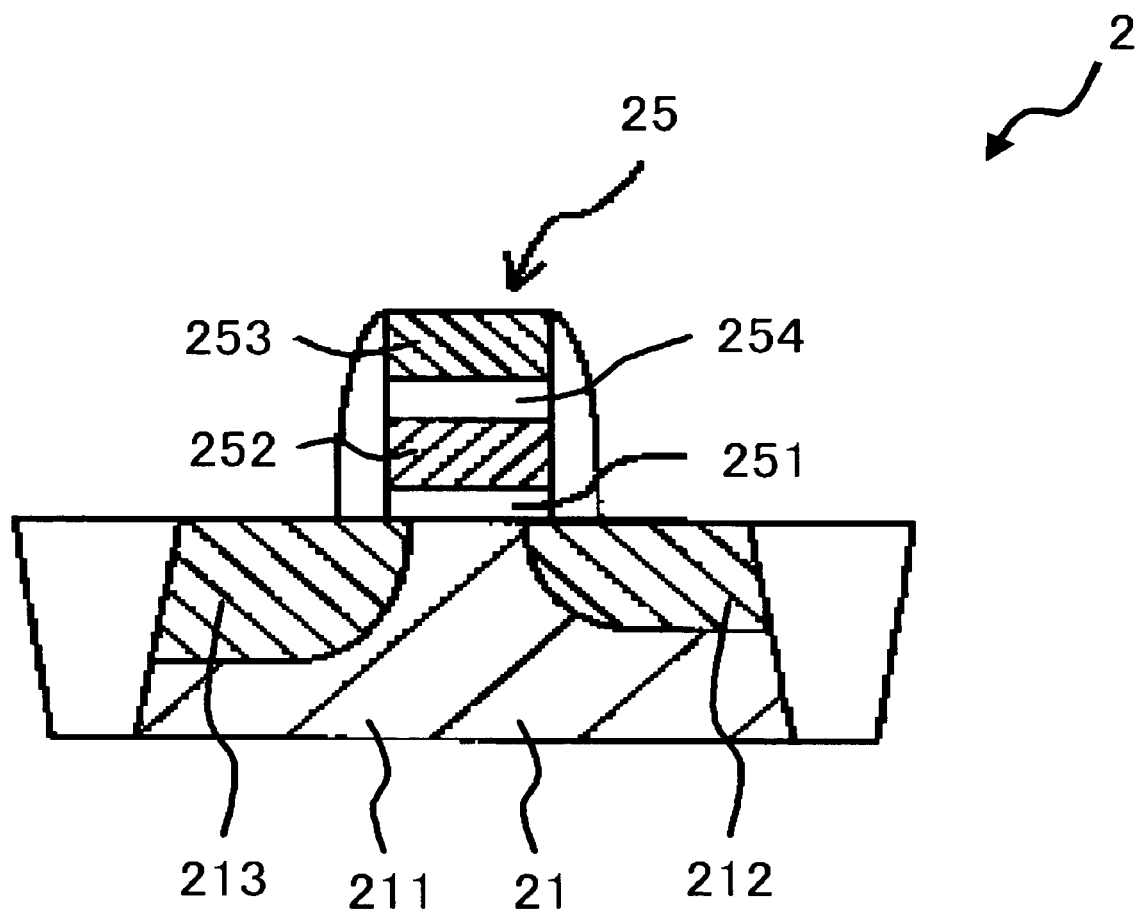
FIG. 12 is a cross-sectional view of a nonvolatile memory semiconductor device according to second embodiment.
Figures 13A, 13B:
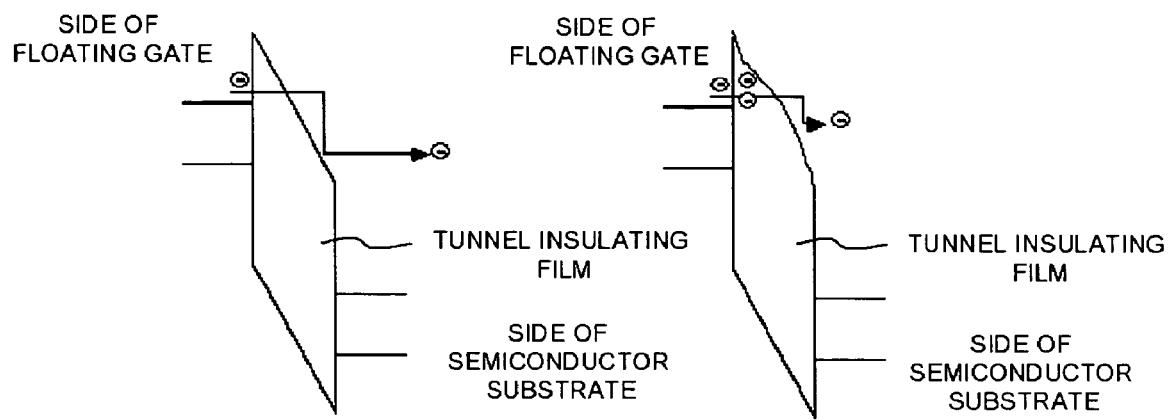
FIG. 13A and FIG. 13B are schematic diagrams, illustrating a trap of electron in the tunnel insulating film.

A nonvolatile memory semiconductor device 2 of the present embodiment is shown in FIG. 12. The nonvolatile memory semiconductor device 2 includes a silicon substrate 21 composed of a semiconductor substrate and a memory cell 25 disposed on the silicon substrate 21. The memory cell 25 includes a tunnel insulating film 251 composed of a silicon oxide film containing nitrogen provided on the silicon substrate 21, a floating gate 252 disposed on such tunnel insulating film 251 and adjacent to the tunnel insulating film 251, and the control gate 253 provided to be capacitively coupled to the aforementioned floating gate 252 through an insulating film 254. A p-type well 211 is formed in the silicon substrate 21 by ion implanting a p-type impurity. In addition, an n-type source region 212 and an n-type drain region 213 are formed a region in the p-type well 211 located in the side of the tunnel insulating film 251. Concentration of atomic nitrogen in the tunnel insulating film 251 is 0.1 to 5 atomic %. Further, concentration of atomic nitrogen in an interface layer of the tunnel insulating film 251 (area from the surface of the tunnel insulating film 251 in the side of the floating gate 252 [i.e., surface contacting with the floating gate 252] to the vicinity of the surface [i.e., locations disposed inside of the tunnel insulating film 251 by 3 nm from the surface]) is 10 times or more higher than concentration of atomic nitrogen in other portions except the tunnel insulating film 251.

More specifically, the tunnel insulating film 251 has configured that concentration of atomic nitrogen in the interface layer that contacts with the portion retaining electron in the process of erasing data from the nonvolatile memory semiconductor device 2 (i.e., the portion having higher electronic energy) is 10 times or more higher than concentration of atomic nitrogen in other portions thereof. Density per unit area of atomic nitrogen in the surface of the tunnel insulating film 251 contacting with the floating gate 252 is equal to or lower than $4 \times 10^{14}$ atoms/cm$^2$.

Next, operations of thus configured nonvolatile memory semiconductor device 2 will be described. When writing data on the nonvolatile memory semiconductor device 2 is conducted, the silicon substrate 11 is, for example, grounded, the n-type source region 212 is opened, a positive medium voltage (+5 V) is applied to the n-type drain region 213, and a positive higher voltage (+10 V) is applied to the control gate 253. In this case, electron flows from the source region 212 into the drain region 213, and hot electron generated around a boundary between the p-type well 211 and the drain region 213 is injected into the floating gate 252 through the tunnel insulating film 251, where electron is tunneled therethrough. This achieves writing data thereon. On the other hand, when data stored on the nonvolatile memory semiconductor device 2 is erased, the silicon substrate 21 is, for example, grounded, the drain region 213 is opened, null voltage (0 V) is applied to the control gate 253 and a positive higher voltage (+12 V) is applied to the source region 212. In this case, electron in the floating gate 252 is drawn to the higher potential created in the source region 212, and then Fowler Nordheim (FN)-tunneled through the tunnel insulating film 251, and eventually pulled out to the source region 212. This achieves erasing data. Alternatively, for example, electron can be pulled out to the source region 212 from the floating gate 252 by applying larger negative voltage (−8V) to the control gate 253 and by applying lower positive voltage (+5V) to the source region 212, thereby achieving the erase of data.

Such nonvolatile memory semiconductor device 2 is produced as follows. In this case, concentration of atomic nitrogen in the tunnel insulating film 251 is 0.1 to 5 atomic %, and the tunnel insulating film 251 is formed on the silicon substrate 21 to have concentration of atomic nitrogen in a area extending from the surface of tunnel insulating film 251 in the side of the floating gate 252 to the vicinity of such surface in the interface layer of the tunnel insulating film 251 of 10 times or more higher than concentration of atomic nitrogen in other portions except the interface layer of the tunnel insulating film 251. More specifically, a CVD oxide film having a thickness of 20 nm is formed on the silicon substrate 21 via a chemical vapor deposition process that employs dichlorosilane (SiH$_2$Cl$_2$) and N$_2$O gas as source gases. Next, the silicon substrate 21 disposed in the plasma nitriding apparatus. N2 and Ar gases are introduced into the plasma nitriding apparatus, and a nitrogen plasma of lower energy around 3 eV is generated. The CVD oxide film formed on the silicon substrate 11 is treated with the above-described nitrogen plasma at a temperature from a room temperature to around 400 degree C., such that nitrogen is doped only in the surface of the CVD oxide film. As a result, the tunnel insulating film 251 including the interface layer formed thereon, which has concentration of atomic nitrogen of 10 times or more higher than concentration of atomic nitrogen in other portions except the interface layer, is obtained on the surface of the CVD oxide film or in other words on the surface in the side of the floating gate 252. In addition to above, lower energy for generating nitrogen plasma is preferable, and even lower energy of equal to or lower than 3 eV may be available if the energy can be sufficient to induce plasma. Since increased energy of nitrogen plasma may cause a fear that nitrogen is penetrated into the interior of the CVD oxide film, it is preferable to control the energy to equal to or lower than 5 eV. As described above, the tunnel insulating film 251 is formed. Thereafter, the floating gate 252 is formed, and further, the insulating film 254 is formed on the floating gate 252. Thereafter, the control gate 253 is formed on the insulating film 254.

The nature of the interface layer of such tunnel insulating film 251, distribution and concentration of atomic nitrogen in respective binding conditions in the interface layer are similar to that of the tunnel insulating film 151 in the above-described embodiment. According to such nonvolatile memory semiconductor device 2 of the present embodiment, the advantageous effects obtainable by employing the nonvolatile memory semiconductor device 1 can also be obtained.

Here, differences of the tunnel insulating film 251 of the present embodiment from the tunnel insulating film described in Japanese Patent Laid-Open No. H11-317,463 (1999) will be described. While Japanese Patent Laid-Open No. H11-317,463 describes that a tunnel insulating film is formed by annealing a multi-layered film composed of a thermal oxidation film and a CVD oxide film within a nitrogen atmosphere, no description on distribution of concentration of atomic nitrogen in the tunnel insulating film is contained therein. It is considered that, when the tunnel insulating film is formed by the method described in Japanese Patent Laid-Open No. H11-317,463, higher concentration of atomic nitrogen is limited only in the CVD oxide film in the side of the semiconductor substrate or more specifically only in the side opposite to the floating gate. In this case, concentration of atomic nitrogen in the interface layer of the tunnel insulating film adjacent to the portion having higher electronic energy can not be increased during erasing data store in the nonvolatile memory semiconductor device of the tunnel insulating film. Therefore, it is considered that creation of trap site for electron can not be prevented, and thus deterioration of the tunnel insulating film can not be prevented. On the contrary, in the tunnel insulating film 251 of the present embodiment, concentration of atomic nitrogen in the interface layer in the side of the floating gate 252, or in the interface layer in the tunnel insulating film 251 that is adjacent to the portion retaining electron in the process of erasing data from the nonvolatile memory semiconductor device 2 (i.e., the portion having higher electronic energy) is increased, creation of trap site for electron can be prevented, thereby surely preventing deterioration of the tunnel insulating film.

While the preferred embodiments of the present invention have been described above in reference to the annexed figures, it should be understood that the disclosures above are presented for the purpose of illustrating the present invention, and various configurations other than the above-described configurations can also be adopted. For example, while it is described that density per unit area of nitrogen in the surfaces contacting with the floating gates 152 and 252 of the tunnel insulating films 151 and 251 is equal to or lower than $4 \times 10^{14}$ atoms/cm$^2$ in the respective embodiments, density per unit area is not limited thereto, and may be larger than $4 \times 10^{14}$ atoms/cm$^2$. However, roughening of the surface described above can be prevented by presenting density per unit area of nitrogen in the surfaces contacting with the floating gates 152 and 252 of the tunnel insulating films 151 and 251 of equal to or lower than $4 \times 10^{14}$ atoms/cm$^2$, thereby preventing the reduction of on-state current due to coulomb scattering. Further, while it is described that the p-type well is formed in the semiconductor substrate and the n-type source region and the n-type drain region is formed in this p-type well in the respective embodiments, the well, the source region and the drain region in the semiconductor substrate are not limited to have these conductivity types. Further, voltages applied to the nonvolatile memory semiconductor devices 1 and 2 in case of writing data on and erasing data stored in the nonvolatile memory semiconductor devices 1 and 2 are not limited to values specified on the above embodiments.

It is apparent that the present invention is not limited to the above embodiment, that may be modified and changed without departing from the scope and spirit of the invention.

What is claimed is:

1. A nonvolatile memory semiconductor device, comprising:
   a semiconductor substrate;
   a floating gate provided on said semiconductor substrate;
   a control gate provided on said semiconductor substrate; and
   a tunnel insulating film, composed of a silicon oxide film and disposed adjacent to said floating gate,
   wherein concentration of atomic nitrogen in said tunnel insulating film is 0.1 to 5 atomic %,
   and wherein concentration of atomic nitrogen in an interface layer of said tunnel insulating film is 10 times or more higher than concentration of atomic nitrogen in other portion of said tunnel insulating film except said interface layer, said interface layer extending from a surface of said tunnel insulating film in a side of said floating gate to a vicinity of said surface.

2. The nonvolatile memory semiconductor device according to claim 1, wherein said tunnel insulating film is disposed between said floating gate and said control gate.

3. The nonvolatile memory semiconductor device according to claim 1, wherein said tunnel insulating film is provided on said semiconductor substrate, and said floating gate is provided on said tunnel insulating film.

4. The nonvolatile memory semiconductor device according to claim 1, wherein density per unit area of atomic nitrogen in the surface of said tunnel insulating film in the side of said floating gate is equal to or lower than $4 \times 1014$ atoms/cm$^2$.

5. The nonvolatile memory semiconductor device according to claim 1, wherein nitrogen (N) atoms in four types of binding conditions exist on said interface layer of said tunnel insulating film,
   said four types of binding conditions including:
   first binding condition, in which all of first proximal atom directly bonded to nitrogen atom are silicon (Si) atoms, and second proximal atom bonded to Si atom are N atom or Si atom;
   second binding condition, in which all of first proximal atom directly bonded to nitrogen atom are silicon (Si) atom, and second proximal atom bonded to Si atoms include one or more oxygen atom;
   third binding condition, in which two of first proximal atom directly bonded to nitrogen atom are silicon (Si) atom, and one thereof is oxygen (O) atom; and
   fourth binding condition, in which one of first proximal atom directly bonded to nitrogen atom are silicon (Si) atom, and two thereof are oxygen (O) atom,
   wherein substantially no nitrogen atom in fifth binding condition, in which all of first proximal atom directly bonded to nitrogen atom are oxygen (O) atom, exists on said interface layer.

6. The nonvolatile memory semiconductor device according to claim 5, wherein concentration of nitrogen atom in second binding condition in said interface layer is equal to or higher than twice of concentration of nitrogen atom in first binding condition.

7. The nonvolatile memory semiconductor device according to claim 5, wherein substantially no nitrogen atom in fifth binding condition exist in said tunnel insulating film.

8. The nonvolatile memory semiconductor device according to claim 1, wherein said interface layer comprises a nitrided region of said tunnel insulating film extending from a boundary of said tunnel insulating film with said floating gate and having a thickness of about 3 nm.

9. A method for manufacturing a nonvolatile memory semiconductor device, said nonvolatile memory semiconductor device comprising: a semiconductor substrate; a floating gate provided on said semiconductor substrate; a control gate; a tunnel insulating film, disposed adjacent to said floating gate and composed of a silicon oxide film, wherein concentration of atomic nitrogen in said tunnel insulating film is 0.1 to 5 atomic %, and wherein said method further comprises forming said tunnel insulating film to have concentration of atomic nitrogen in an interface layer of said tunnel insulating film that is 10 times or more higher than concentration of atomic nitrogen in other portion of said tunnel insulating film except said interface layer, said interface layer extending from a surface of said tunnel insulating film in a side of said floating gate to a vicinity of said surface.

10. The method for manufacturing a nonvolatile memory semiconductor device according to claim 9, wherein said method comprises:

forming said floating gate on said semiconductor substrate;

said forming said tunnel insulating film; and forming said control gate on said tunnel insulating film, and wherein, in said forming said tunnel insulating film, a silicon oxide film is formed on said floating gate via a chemical vapor deposition (CVD) process, and then, said silicon oxide film is heat-treated within $N_2O$ gas at a temperature of equal to or higher than 950 degree C. to form said tunnel insulating film.

11. The method for manufacturing a nonvolatile memory semiconductor device according to claim 9, wherein said method comprises:

said forming the tunnel insulating film;

forming said floating gate on said tunnel insulating film; and forming said control gate on said floating gate, wherein, in said forming the tunnel insulating film, a silicon oxide film is formed on said semiconductor substrate gate via a chemical vapor deposition (CVD) process, and then, said silicon oxide film is exposed to a plasma within a gas containing nitrogen to form said tunnel insulating film.

12. The method for manufacturing a nonvolatile memory semiconductor device according to claim 9, wherein said forming said tunnel insulating film further comprises forming a silicon oxide film on said floating gate and heat-treating said silicon oxide film with $N_2O$ gas to form said interface layer comprising a region of said tunnel insulating film extending from a boundary between said tunnel insulating film and said floating gate and having a thickness of about 3 nm.

* * * * *